(12) United States Patent
Shideler

(10) Patent No.: US 6,861,323 B2
(45) Date of Patent: Mar. 1, 2005

(54) METHOD FOR FORMING A SIGE HETEROJUNCTION BIPOLAR TRANSISTOR HAVING REDUCED BASE RESISTANCE

(75) Inventor: Jay A. Shideler, Los Altos Hills, CA (US)

(73) Assignee: Micrel, Inc., San Jose, CA (US)

( * ) Notice: Subject to any disclaimer, the term of this patent is extended or adjusted under 35 U.S.C. 154(b) by 79 days.

(21) Appl. No.: 10/371,932

(22) Filed: Feb. 21, 2003

(65) Prior Publication Data

US 2004/0166645 A1 Aug. 26, 2004

(51) Int. Cl.$^7$ ............................................ H01L 21/331
(52) U.S. Cl. ...................................... 438/309; 438/312
(58) Field of Search ................................ 438/309–350

(56) References Cited

U.S. PATENT DOCUMENTS

| | | | | |
|---|---|---|---|---|
| 5,024,957 A | * | 6/1991 | Harame et al. | 438/367 |
| 5,897,359 A | * | 4/1999 | Cho et al. | 438/312 |
| 6,437,376 B1 | * | 8/2002 | Ozkan | 257/197 |
| 6,680,522 B1 | * | 1/2004 | Sato | 257/588 |
| 2003/0042504 A1 | * | 3/2003 | Azam et al. | 257/197 |

* cited by examiner

Primary Examiner—H. Jey Tsai
(74) Attorney, Agent, or Firm—Patent Law Group LLP; Carmen C. Cook

(57) ABSTRACT

A method for forming a heterojunction bipolar transistor includes forming an epitaxial layer, forming a first polysilicon layer, and forming a dielectric layer on the first polysilicon layer. The first polysilicon layer and the dielectric layer include an opening for exposing a portion of the top surface of the epitaxial layer. Then, a silicon germanium layer is selectively grown in the opening. The silicon germanium layer is grown on the exposed top surface of the epitaxial layer and on the exposed sidewall of the first polysilicon layer. Next, a spacer is formed along the sidewalls of the dielectric layer and the silicon germanium layer. A second polysilicon layer in electrical contact with the silicon germanium layer is then formed. Accordingly, a low resistance connection between the first polysilicon layer forming the extrinsic base region and the silicon germanium layer forming the intrinsic base region of the transistor is formed.

28 Claims, 3 Drawing Sheets

METHOD FOR FORMING A SIGE HETEROJUNCTION BIPOLAR TRANSISTOR HAVING REDUCED BASE RESISTANCE

FIELD OF THE INVENTION

The invention relates to heterojunction bipolar transistors and a method for manufacturing thereof and, in particular, to a heterojunction bipolar transistor with reduced base resistance.

DESCRIPTION OF THE RELATED ART

Heterojunction bipolar transistors (HBTs) are bipolar transistors where the emitter and base regions are made of dissimilar materials. In general, the base region is made with a material, such as silicon germanium (SiGe), which has a narrower bandgap than silicon. Alternately, the emitter region can be made with a material with a wider bandgap than silicon. The bandgap difference between the emitter and base junctions enhances the current gain and thus the operating frequency of the transistors. HBTs have applications in integrated circuits requiring high switching speed, such as those operating at 100 GHz or above operating frequencies.

A HBT made with a SiGe base region typically includes an extrinsic base portion made of doped polysilicon and an intrinsic base portion made of SiGe. Prior art processes have difficulties obtaining a low-resistance connection between the extrinsic base portion and intrinsic base portion. Therefore, it is desirable to provide a method for forming a SiGe HBT with low resistance connection between the extrinsic and intrinsic base portions.

SUMMARY OF THE INVENTION

According to one embodiment of the present invention, a method for forming a heterojunction bipolar transistor includes forming an epitaxial layer of a first conductivity type on a semiconductor substrate, forming a first polysilicon layer of a second conductivity type on the epitaxial layer, and forming a first dielectric layer on the first polysilicon layer. The first polysilicon layer and the first dielectric layer include an opening for exposing a portion of the top surface of the epitaxial layer. The method further includes growing selectively a silicon germanium layer in the opening where the silicon germanium layer is grown on the top surface of the epitaxial layer and on the sidewall of the first polysilicon layer exposed by the opening, forming a spacer along the sidewall of the silicon germanium layer and the sidewall of the first dielectric layer in the opening, and forming a second polysilicon layer of the first conductivity type over the opening where the second polysilicon layer overlies the first dielectric layer and the spacer and is in electrical contact with the silicon germanium layer.

In one embodiment, the epitaxial layer forms a collector region of the transistor, the first polysilicon layer forms an extrinsic base region of the transistor, the silicon germanium layer forms an intrinsic base region of the transistor, and the second polysilicon layer forms an emitter region of the transistor.

In another embodiment, the silicon germanium layer includes a polycyrstalline silicon germanium portion formed at the sidewall of the silicon germanium layer abutting the first polysilicon layer and a single-crystalline silicon germanium portion formed above the epitaxial layer. In this manner, a low resistance connection between the extrinsic base region and the intrinsic base region of the heterojunction bipolar transistor is formed.

The present invention is better understood upon consideration of the detailed description below and the accompanying drawings.

DETAILED DESCRIPTION OF THE PREFERRED EMBODIMENTS

In accordance with the principles of the present invention, a method for forming a heterojunction bipolar transistor (HBT) includes forming an extrinsic base region in doped polysilicon and forming an intrinsic base region in a silicon-germanium (SiGe) film such that a low resistance connection is formed between the extrinsic base region and the intrinsic base region. In one embodiment, the intrinsic base region is formed by selectively growing SiGe in a base opening such that the intrinsic base region includes a polycrystalline SiGe portion formed at the sidewall abutting the extrinsic base region and a single-crystalline SiGe portion elsewhere. As a result, a low resistance connection between the extrinsic base region and the intrinsic base region is realized.

Figure 1:
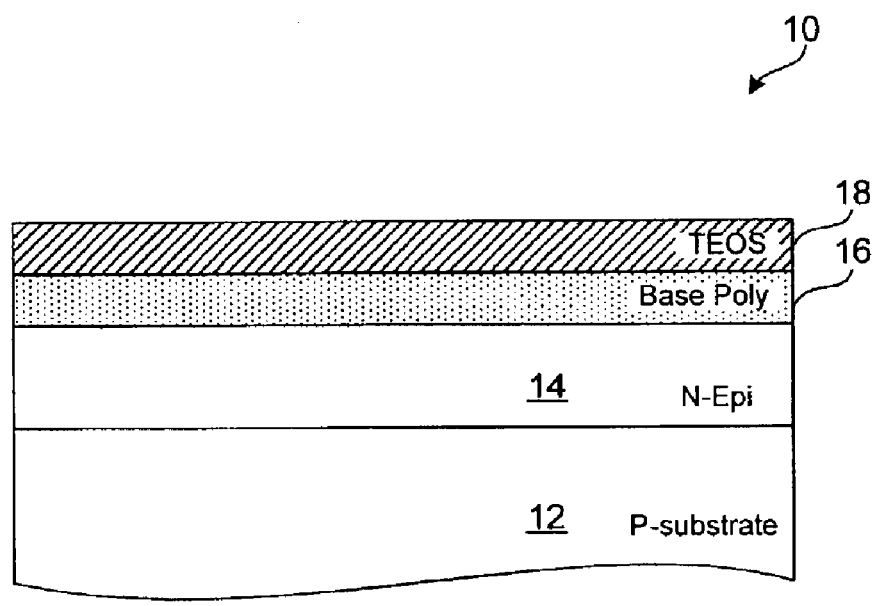
FIGS. 1–5 illustrate the method of manufacturing an NPN SiGe HBT according to one embodiment of the present invention.

FIGS. 1–5 illustrate the method of manufacturing an NPN SiGe HBT according to one embodiment of the present invention. Referring to FIG. 1, a semiconductor structure 10 includes a portion of a semiconductor substrate 12 on which the SiGe HBT of the present invention is to be formed. In the present embodiment, substrate 12 is a p-type silicon substrate. An n-type epitaxial layer (N-Epi) 14 is formed on substrate 12 using conventional methods. N-Epi 14 forms the collector terminal of the NPN HBT. Electrical connections to N-Epi 14 can be formed using any conventional methods, such as by forming a buried layer (not shown) in electrical connection with N-Epi 14 and a collector sinker region (not shown) contacting the buried layer.

Then, a polysilicon layer 16 is formed on N-Epi 14, such as by using conventional chemical vapor deposition processes. Polysilicon layer 16 forms the extrinsic base region of the NPN HBT. In the present embodiment, polysilicon layer 16 (or base poly 16) is doped with boron, such as by means of an ion implantation step, and the thickness of polysilicon layer 16 is about 2000 Å. Following the polysilicon deposition, a dielectric layer 18 is formed on the top surface of polysilicon layer 16. Dielectric layer 18 functions to insulate the base region of the transistor from subsequent layers. In the present embodiment, the dielectric layer is an oxide layer. In particular, dielectric layer 18 is a TEOS film (TEOS layer 18) having a thickness of about 2000 Å.

Figure 2:
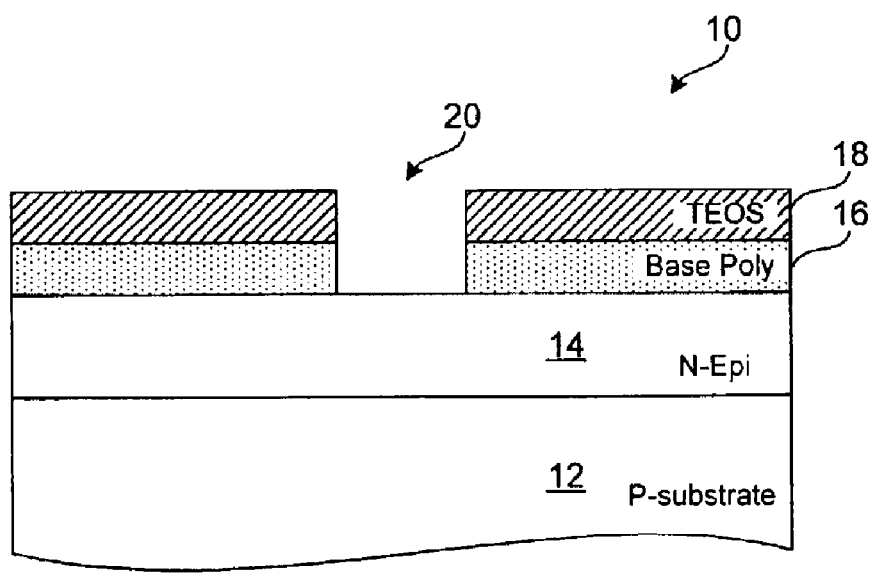

Referring to FIG. 2, an opening 20 is formed in TEOS layer 18 and base poly 16 for defining the base and the emitter regions of the NPN HBT. Opening 20 can be formed using conventional masking and dry etching techniques.

Next, an epitaxial process is carried out to grow SiGe selectively over semiconductor structure 10. The epitaxial process operates such that SiGe will only grow on surfaces with exposed silicon or polysilicon but will not grow on surfaces with silicon dioxide or other oxide material. Therefore, when semiconductor structure 10 of FIG. 2 is exposed to the selective epitaxial process, SiGe will only grow at the bottom of opening 20 where the silicon material of N-Epi 14 is exposed. In addition, SiGe will grow on the sidewall of base poly 16 exposed by opening 20. However, the growth of SiGe along the sidewall of the opening will cease at the top of base poly 16 as no SiGe will grow on the sidewall of TEOS layer 18.

Figure 3:
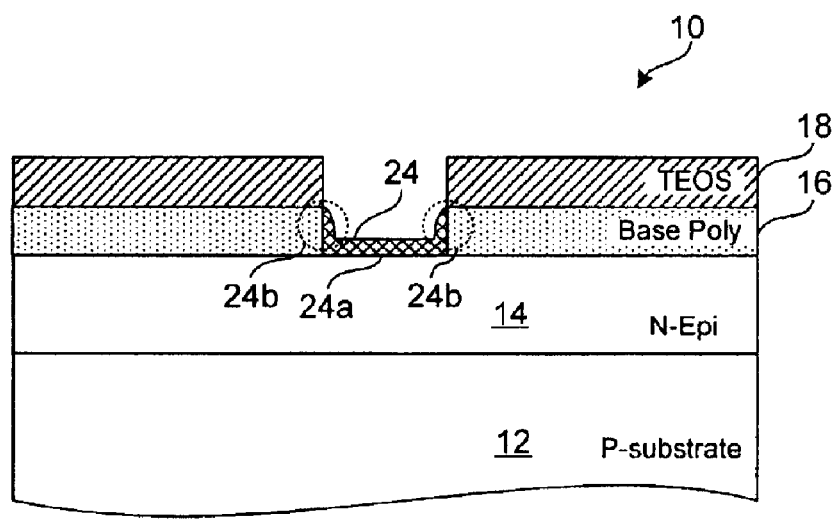

Referring to FIG. 3, the SiGe epitaxial process forms a SiGe film 24 in opening 20. Specifically, SiGe epitaxial film 24 is formed on the surface of N-Epi 14 and along the sidewall of base poly 16. The crystalline structure of SiGe film 24 conforms to that of the surfaces on which it is formed. That is, a portion of SiGe film 24 has a single-crystalline structure where the film is grown on the surface of N-Epi 14, as indicated by reference numeral 24a. However, SiGe film 24 transitions to a polycrystalline structure where the film is grown on the sidewall of base poly 16, as indicated by a sidewall portion 24b. During the growth of SiGe film 24, the SiGe film can be doped with p-type dopants, such as boron. That is, in-situ doping of the SiGe film can be performed.

SiGe film 24 forms an intrinsic base region for the NPN SiGe HBT to be formed and the portion of SiGe film 24 meeting the sidewall of base poly 16 form a direct electrical connection with the base poly which forms the extrinsic base region. By growing and forming a polycrystalline SiGe film along the sidewall of base poly 16, a low resistance electrical connection is made between the intrinsic base region and the extrinsic base region. Furthermore, a low base to collector capacitance can be achieved.

Figure 4:
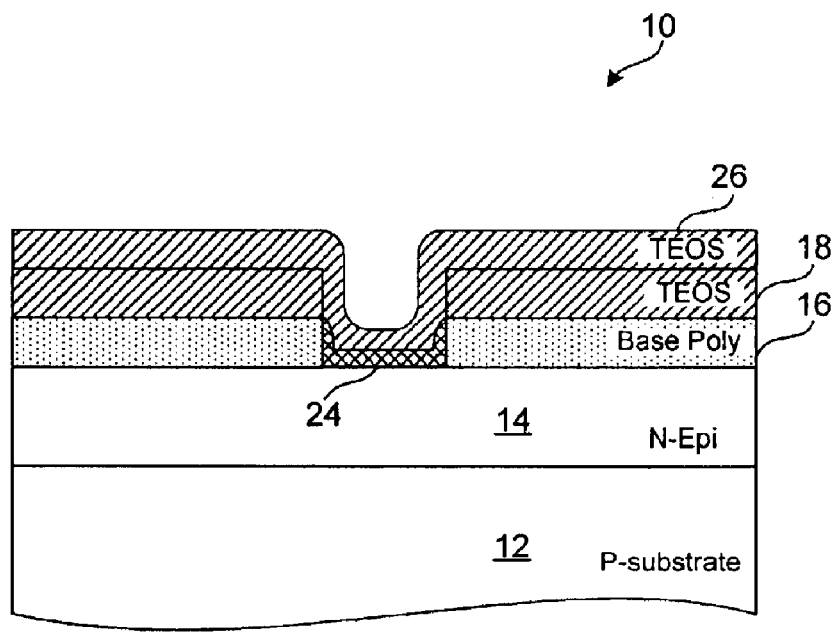
Figure 5:
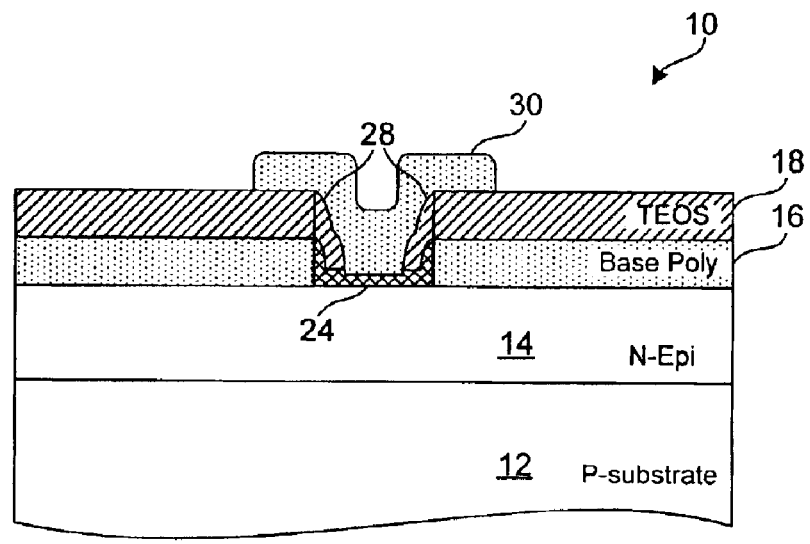

After the formation of SiGe film 24, a dielectric layer 26, such as a TEOS layer, is formed over the surface of the semiconductor structure to encapsulate the SiGe film, as shown in FIG. 4. In the present embodiment, TEOS layer 26 is about 1500 Å. TEOS layer 26 is then anisotropically etched to form a spacer 28 along the sidewall of opening 20, as shown in FIG. 5. During the etching process to form spacer 28, a small amount of SiGe layer 24, about 10 to 25 Å, is also etched. Then, a polysilicon layer 30 is formed over semiconductor structure 10 and patterned to form the emitter terminal of the NPN SiGe HBT. Polysilicon layer 30 can be formed by depositing a polysilicon layer and then doping the layer using N-type dopants, such as using ion implantation. Polysilicon layer 30 can also be formed by depositing a polysilicon layer and performing in-situ doping. As a result of the above processing steps, a SiGe HBT with a low base resistance between the extrinsic and intrinsic base regions is formed.

In an alternate embodiment of the present invention, the epitaxial process for forming SiGe film 24 incorporates carbon in the SiGe film. Carbon functions to suppress the out-diffusion of p-type dopants that is incorporated in SiGe film 14. SiGeC HBTs therefore have the potential to achieve even higher cut-off frequency, well above 100 GHz. The carbon concentration may range from about 0.04% to 0.5%. Typically carbon concentration is about 0.1% to 0.2%.

In another embodiment of the present invention, the width of spacer 28 can be made wider to increase the distance between the emitter terminal of the HBT and the polycrystalline SiGe base terminal. The widening of spacer 28 helps to prevent minority carrier recombination from occurring at the sidewall of SiGe layer 24 due to poly SiGe formations at the sidewall portion 24b of the SiGe layer. The problem caused by minority carrier recombination tends to be exacerbated at the inside corners of SiGe layer 24 where sidewall poly SiGe portion 24b meets single-crystalline base poly portion 24a. Of course, widening spacer 28 can have the effect of increasing the base resistance between the extrinsic base poly 16 and the intrinsic base SiGe 24.

Figure 6:
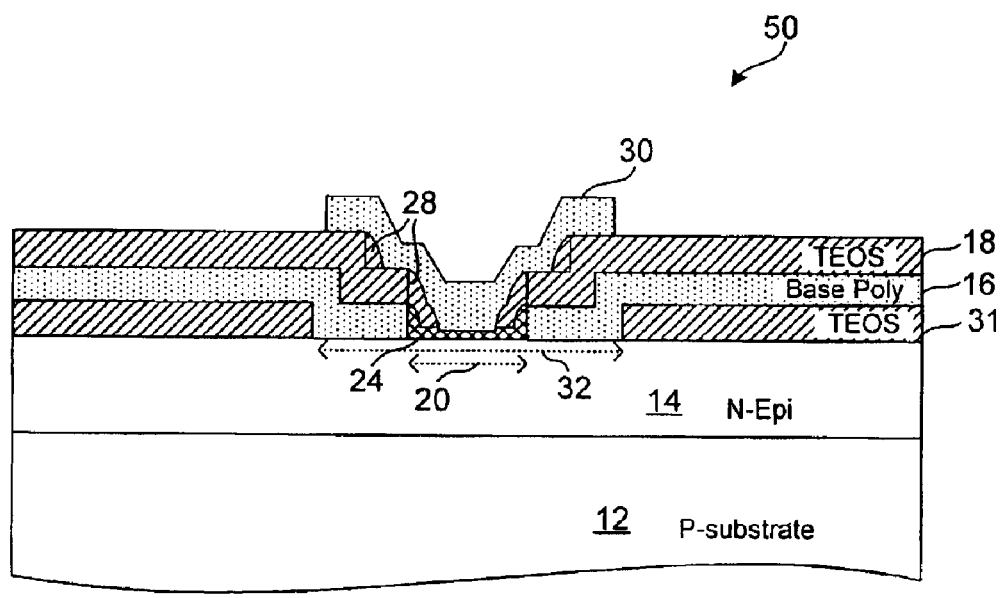
FIG. 6 is a cross-sectional view of a SiGe HBT according to an alternate embodiment of the present invention.

FIG. 6 is a cross-sectional view of a SiGe HBT according to an alternate embodiment of the present invention. Referring to FIG. 6, semiconductor structure 50 can be fabricated using the same processing steps as described above with reference to semiconductor structure 10. Like elements in FIG. 6 and in the previous figures are given like reference numerals to simplify the discussion. In semiconductor structure 50, a dielectric layer 31 is formed on top of N-Epi 14 prior to the formation of polysilicon layer (base poly) 16. In the present embodiment, dielectric layer 31 is a deposited TEOS layer and has a thickness of 1,000 Å to 2,000 Å. Following the deposition of dielectric layer 31, a window 32 is formed in the dielectric layer using conventional masking and etching steps. As shown in FIG. 6, window 32 extends beyond window 20 which is the opening for forming the base and the emitter regions of the HBT. As a result, when base poly 16 and dielectric layer 18 are deposited and etched to form window 20, a portion of base poly 16 is formed on N-Epi 14, making direct electrical contact with N-Epi 14. After window 20 is formed, SiGe layer 24 and polysilicon layer 30 are then formed in the same manner as described above in reference to semiconductor structure 10.

The SiGe HBT formed in semiconductor structure 50 has the advantage of reduced extrinsic capacitance between base poly 16 and N-Epi 14 while allowing for a direct electrical connection of base poly 16 to the intrinsic base SiGe layer 24. The reduced extrinsic capacitance is accomplished by isolating the base poly layer from the N-Epi layer using a dielectric layer. In semiconductor structure 50, window 32 is not self aligned and therefore care must be taken to ensure proper alignment of window 32 with respect to window 20.

The above detailed descriptions are provided to illustrate specific embodiments of the present invention and are not intended to be limiting. Numerous modifications and variations within the scope of the present invention are possible. The present invention is defined by the appended claims.

I claim:

1. A method for forming a heterojunction bipolar transistor, comprising:

forming an epitaxial layer of a first conductivity type on a semiconductor substrate;

forming a first polysilicon layer of a second conductivity type directly on the epitaxial layer;

forming a first dielectric layer on the first polysilicon layer, wherein the first polysilicon layer and the first dielectric layer include an opening for exposing a portion of the top surface of the epitaxial layer, the opening being formed by masking and etching of the first dielectric layer and the first polysilicon layer;

growing selectively a silicon germanium layer in the opening, wherein the silicon germanium layer is grown on the top surface of the epitaxial layer and on the sidewall of the first polysilicon layer exposed by the opening;

forming a spacer along the sidewall of the silicon germanium layer and the sidewall of the first dielectric layer in the opening; and forming a second polysilicon layer of the first conductivity type over the opening, wherein the second polysilicon layer overlies the first dielectric layer and the spacer and is in electrical contact with the silicon germanium layer.

2. The method of claim 1, wherein the epitaxial layer forms a collector region of the transistor, the first polysilicon layer forms an extrinsic base region of the transistor, the silicon germanium layer forms an intrinsic base region of the transistor, and the second polysilicon layer forms an emitter region of the transistor.

3. The method of claim 2, wherein the silicon germanium layer comprises a polycyrstalline silicon germanium portion formed at the sidewall of the silicon germanium layer abutting the first polysilicon layer and a single-crystalline silicon germanium portion formed above the epitaxial layer.

4. The method of claim 1, wherein the first conductivity type is n-type and the second conductivity type is p-type.

5. The method of claim 1, wherein forming a first polysilicon layer and forming a first dielectric layer, wherein the first polysilicon layer and the first dielectric layer include an opening for exposing a portion of the top surface of the epitaxial layer, comprise:
depositing a polysilicon film on the epitaxial layer;
performing ion implantation using dopants of the second conductivity type;
depositing a dielectric film on the polysilicon film; and
patterning the polysilicon film and the dielectric film to define the opening, thereby forming the first polysilicon layer and the first dielectric layer.

6. The method of claim 1, wherein the first dielectric layer comprises a silicon oxide layer.

7. The method of claim 1, wherein the first dielectric layer comprises a TEOS layer.

8. The method of claim 1, wherein forming a spacer along the sidewall of the silicon germanium layer comprises:
depositing a second dielectric layer over the first dielectric layer and the silicon germanium layer; and
anisotropically etching the second dielectric layer to form the spacer along the sidewall of the first dielectric layer and the sidewall of the silicon germanium layer.

9. The method of claim 8, wherein the second dielectric layer comprises a TEOS layer.

10. The method of claim 1, wherein forming a second polysilicon layer of the first conductivity type over the opening comprises:
depositing a polysilicon film over the first dielectric layer and the opening;
performing ion implantation using dopants of the first conductivity type; and
patterning the polysilicon film to form the second polysilicon layer over the opening.

11. The method of claim 1, wherein forming a second polysilicon layer of the first conductivity type over the opening comprises:
depositing a polysilicon film over the first dielectric layer and the opening and performing in-situ doping of the polysilicon film using dopants of the first conductivity type; and
patterning the polysilicon film to form the second polysilicon layer over the opening.

12. The method of claim 1, wherein growing selectively a silicon germanium layer in the opening comprises growing selectively a silicon germanium carbon layer in the opening.

13. The method of claim 1, wherein growing selectively a silicon germanium layer comprises growing a silicon germanium layer using an epitaxial process and performing in-situ doping of the silicon germanium layer using dopants of the second conductivity type.

14. A method for forming a heterojunction bipolar transistor, comprising:
forming a collector region in a semiconductor layer of a first conductivity type on a semiconductor substrate;
forming an extrinsic base region in a polysilicon layer of the second conductivity type overlaying the collector region, the polysilicon layer being formed directly on the semiconductor layer;
forming a dielectric layer over the extrinsic base region, wherein the dielectric layer and the extrinsic base region include a central aperture exposing a portion of the top surface of the collector region, wherein the center aperture is formed by masking and etching of the polysilicon layer of the second conductivity type and the dielectric layer;
forming an intrinsic base region in the central aperture, the intrinsic base region comprising a silicon germanium layer being selectively grown on an exposed top surface of the collector region and an exposed sidewall of the extrinsic base region in the center aperture;
forming a spacer in a dielectric material over the intrinsic base region and along the sidewall of the dielectric layer; and
forming an emitter region in a polysilicon layer of the first conductivity type, the emitter region overlying the dielectric layer and the spacer and being in electrical contact with the intrinsic base region.

15. The method of claim 14, wherein the first conductivity type is n-type and the second conductivity type is p-type.

16. The method of claim 14, wherein the silicon germanium layer comprises a polycyrstalline silicon germanium portion formed at the sidewall of the silicon germanium layer abutting the extrinsic base region and a single-crystalline silicon germanium portion formed above the exposed top surface of the collector region.

17. The method of claim 14, wherein the semiconductor layer comprises an epitaxial silicon layer of the first conductivity layer.

18. The method of claim 17, wherein forming an extrinsic base region in a polysilicon layer and forming a dielectric layer over the extrinsic base region, wherein the dielectric layer and the extrinsic base region include a central aperture exposing a portion of the top surface of the collector region, comprise:
depositing a polysilicon film on the semiconductor layer;
performing ion implantation using dopants of the second conductivity type;
depositing a dielectric film on the polysilicon film; and
patterning the polysilicon film and the dielectric film to define the central aperture, thereby forming the extrinsic base region and the dielectric layer.

19. The method of claim 14, wherein forming a spacer in a dielectric material comprises:
depositing a second dielectric layer over the dielectric layer and the silicon germanium layer; and
anisotropically etching the second dielectric layer to form the spacer along the sidewall of the first dielectric layer and the sidewall of the silicon germanium layer.

20. The method of claim 14, wherein growing selectively a silicon germanium layer in the opening comprises growing selectively a silicon germanium carbon layer in the opening.

21. The method of claim 14, wherein forming an intrinsic base region comprises:
growing selectively a silicon germanium layer in the center aperture and performing in-situ doping of the silicon germanium layer using dopants of a second conductivity type,
wherein the silicon germanium layer is grown on the top surface of the collector region and on the sidewall of the extrinsic base region exposed by the center aperture.

22. A method for forming a heterojunction bipolar transistor, comprising:
forming an epitaxial layer of a first conductivity type on a semiconductor substrate;
forming a first dielectric layer on the epitaxial layer, the first dielectric layer including a first opening for exposing a pardon of the top surface of the epitaxial layer;
forming a first polysilicon layer of a second conductivity type on the first dielectric layer and the exposed epitaxial layer, the first polysilicon layer forming a step from the first dielectric layer down to the exposed epitaxial layer;
forming a second dielectric layer on the first polysilicon layer, wherein the first polysilicon layer and the second dielectric layer include a second opening for exposing a portion of the top surface of the epitaxial layer, the second opening being smaller than the first opening and being formed by masking and etching of the first polysilicon layer and the first dielectric layer;
growing selectively a silicon germanium layer in the second opening, wherein the silicon germanium layer is grown on the top surface of the epitaxial layer and on the sidewall of the first polysilicon layer exposed by the second opening;
forming a spacer along the sidewall of the silicon germanium layer and the sidewall of the second dielectric layer in the opening; and
forming a second polysilicon layer of the first conductivity type over the second opening, wherein the second polysilicon layer overlies the second dielectric layer and the spacer and is in electrical contact with the silicon germanium layer.

23. The method of claim 22, wherein the epitaxial layer forms a collector region of the transistor, the first polysilicon layer forms an extrinsic base region of the transistor, the silicon germanium layer forms an intrinsic base region of the transistor, and the second polysilicon layer forms an emitter region of the transistor.

24. The method of claim 23, wherein the silicon germanium layer comprises a polycyrstalline silicon germanium portion formed at the sidewall of the silicon germanium layer abutting the first polysilicon layer and a single-crystalline silicon germanium portion formed above the epitaxial layer.

25. The method of claim 22, wherein forming a first polysilicon layer and forming a second dielectric layer, wherein the first polysilicon layer and the second dielectric layer include a second opening for exposing a portion of the top surface of the epitaxial layer, comprise:
depositing a polysilicon film on the first dielectric layer and the exposed epitaxial layer;
performing ion implantation using dopants of the second conductivity type;
depositing a dielectric film on the polysilicon film; and
patterning the polysilicon film and the dielectric film to define the second opening, thereby forming the first polysilicon layer and the second dielectric layer.

26. The method of claim 22, wherein the first dielectric layer and the second dielectric layer each comprises a TEOS layer.

27. The method of claim 22, wherein forming a spacer along the sidewall of the silicon germanium layer comprises:
depositing a third dielectric layer over the second dielectric layer and the silicon germanium layer; and
anisotropically etching the third dielectric layer to form the spacer along the sidewall of the second dielectric layer and the sidewall of the silicon germanium layer.

28. The method of claim 22, wherein growing selectively a silicon germanium layer comprises growing a silicon germanium layer using an epitaxial process and performing in-situ doping of the silicon germanium layer using dopants of the second conductivity type.

* * * * *